(12) United States Patent
Araki et al.

(10) Patent No.: US 10,193,412 B2
(45) Date of Patent: Jan. 29, 2019

(54) ELECTRIC MOTOR CONTROLLER

(71) Applicant: Mitsubishi Electric Corporation, Tokyo (JP)

(72) Inventors: Rei Araki, Tokyo (JP); Yu Kawano, Tokyo (JP); Yoshihito Asao, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 156 days.

(21) Appl. No.: 15/109,832

(22) PCT Filed: May 22, 2014

(86) PCT No.: PCT/JP2014/063573
§ 371 (c)(1),
(2) Date: Jul. 6, 2016

(87) PCT Pub. No.: WO2015/177904
PCT Pub. Date: Nov. 26, 2015

(65) Prior Publication Data
US 2016/0329774 A1 Nov. 10, 2016

(51) Int. Cl.
*H04K 1/02* (2006.01)
*H02K 11/00* (2016.01)
(Continued)

(52) U.S. Cl.
CPC ............. *H02K 5/24* (2013.01); *H02K 11/21* (2016.01); *H02K 11/25* (2016.01); *H02K 11/33* (2016.01);
(Continued)

(58) Field of Classification Search
CPC ............. H02K 1/18; H02K 5/24; H05K 1/18
See application file for complete search history.

(56) References Cited

U.S. PATENT DOCUMENTS 4,687,977 A * 8/1987 Brahmavar ............. H02K 3/16
310/68 C
4,773,829 A * 9/1988 Vettori .................... H02K 7/14
310/68 R
(Continued)

FOREIGN PATENT DOCUMENTS

CN 101933410 A 12/2010
EP 2 445 007 A2 4/2012
(Continued)

OTHER PUBLICATIONS

Communication dated Dec. 19, 2017 from the European Patent Office in counterpart Application No. 14892372.5.
(Continued)

*Primary Examiner* — Bentsu Ro
(74) *Attorney, Agent, or Firm* — Sughrue Mion, PLLC; Richard C. Turner

(57) ABSTRACT

A board includes a separating zone in an area closer to the edge than to the center of the board, the separating zone including one elongated through hole. A first group of electronic components that is a source of heat or electric noise is placed in a first area on the center side with respect to the separating zone of the board. On the other hand, a second group of electronic components from which influence of heat or electric noise from other components needs to be eliminated to a maximum extent is placed in a second area on the edge side with respect to the separating zone of the board.

8 Claims, 7 Drawing Sheets

(51) Int. Cl.
  *H02K 5/24* (2006.01)
  *H02K 11/21* (2016.01)
  *H02K 11/25* (2016.01)
  *H02K 11/33* (2016.01)
  *H05K 1/02* (2006.01)
  *H05K 1/18* (2006.01)
  *H05K 1/11* (2006.01)

(52) U.S. Cl.
  CPC ......... *H05K 1/0201* (2013.01); *H05K 1/0216* (2013.01); *H05K 1/181* (2013.01); *H05K 1/115* (2013.01); *H05K 2201/062* (2013.01); *H05K 2201/09063* (2013.01); *H05K 2201/09972* (2013.01); *H05K 2201/1009* (2013.01); *H05K 2201/10507* (2013.01)

(56) References Cited

U.S. PATENT DOCUMENTS

| | | | | |
|---|---|---|---|---|
| 4,893,073 | A | * | 1/1990 | McDonald ........... G01R 31/315 29/602.1 |
| 5,648,892 | A | * | 7/1997 | Wieloch ................ H02M 7/003 361/707 |
| 5,907,475 | A | * | 5/1999 | Babinski ................ H05K 7/209 361/719 |
| 6,205,028 | B1 | | 3/2001 | Matsumura |
| 6,956,303 | B1 | * | 10/2005 | Uebelein ............. H05K 1/0286 307/10.1 |

| | | |
|---|---|---|
| 2006/0087820 | A1 | 4/2006 Yang et al. |
| 2006/0268527 | A1 | 11/2006 Tanaka et al. |
| 2010/0290183 | A1 | 11/2010 Rijken et al. |
| 2012/0097997 | A1 | 4/2012 Chung et al. |

FOREIGN PATENT DOCUMENTS

| | | |
|---|---|---|
| JP | 55-067182 A | 5/1980 |
| JP | 56-106467 U | 8/1981 |
| JP | 61-196572 U | 12/1986 |
| JP | 01-093792 U | 6/1989 |
| JP | 02-034992 A | 2/1990 |
| JP | 09-298345 A | 11/1997 |
| JP | 11-040901 A | 2/1999 |
| JP | 2004-288687 A | 10/2004 |
| JP | 2011-511455 A | 4/2011 |
| JP | 4877265 B2 | 2/2012 |

OTHER PUBLICATIONS

Communication dated Jun. 27, 2017 by the Japanese Patent Office in counterpart Japanese Patent Application No. 2016520875.
International Search Report of PCT/JP2014/063573 dated Aug. 26, 2014.
Communication dated Jun. 1, 2018 from the State Intellectual Property Office of the P.R.C. in counterpart application No. 201480079077.0.

* cited by examiner

ELECTRIC MOTOR CONTROLLER

CROSS REFERENCE TO RELATED APPLICATIONS

This application is a National Stage of International Application No. PCT/JP2014/063573 filed May 22, 2014, the contents of which are incorporated herein by reference in its entirety.

TECHNICAL FIELD

The present invention relates to an electric motor controller.

BACKGROUND ART

An electric motor controller includes a controller board with a plurality of electronic components mounted thereon for controlling drive of an electric motor. Conventionally, a controller unit that controls on/off timing of a semiconductor switching device included in an inverter for driving an electric motor is known.

For example, an electric power steering apparatus described in PTL 1 includes a controller board with electronic components, including a microcomputer for drive-controlling an electric motor, mounted on a multilayer printed circuit board by soldering. In this example, the controller board, which is generally rectangular, includes a hole provided at the center thereof for passing a shaft of the motor therethrough.

CITATION LIST

Patent Literature

PTL 1 Japanese Patent No. 4,877,265

SUMMARY OF INVENTION

Technical Problem

In recent years, as drive-control of an electric motor becomes complicated, heat generated from semiconductor components, such as a microcomputer or predriver, mounted on the controller board increases, which results in a problem of heat generated from such a heat-generating component increasingly influencing other electronic components on the board. For example, in order to achieve true performance of an electronic component, such as a temperature sensor, influence of heat from other electronic components needs to be eliminated from the electronic component to a maximum extent.

In addition of the problem of heat generation, when power consumption and operating frequency of a microcomputer, predriver or the like increase, electric noise generated from such an electronic component may increase. For example, switching noise generated from a microcomputer may propagate to other electronic components through a ground layer or power supply layer of a printed circuit board and negatively influence the operation or performance of the electronic components.

On the other hand, demands for reducing the size and weight of an electrical equipment becomes increasingly severe year by year, which drives higher density mounting on the controller board. Accordingly, mutual influence of heat and electric noise between electronic components tends to further increase, so the above-described problems have been further serious. In the PTL 1, the controller board has a hole provided at the center thereof, but is not configured so as to be capable of effectively preventing propagation of heat and electric noise between electronic components.

In view of the above problems, it is an object of the present invention to provide an electric motor controller that can suppress mutual influence of heat and electric noise between a plurality of electronic components for controlling drive of an electric motor on a board with the electronic components mounted thereon.

Solution to Problem

The electric motor controller in accordance with the invention includes a board with a plurality of electronic components mounted thereon for controlling drive of an electric motor, the controller including a separating zone in an area closer to the edge than to the center of the board, the separating zone including one or both of a through hole and a notch provided in the board, wherein the plurality of electronic components are grouped into a first group of electronic components and a second group of electronic components depending on the function or characteristic, and the first group of electronic components and the second group of electronic components are placed separated by the separating zone.

Advantageous Effects of Invention

According to the electric motor controller in accordance with the invention, the first group of electronic components and the second group of electronic components grouped depending on the function or characteristic are placed separated by the separating zone, which can effectively prevent heat and electric noise from propagating between the first group of electronic components and the second group of electronic components, allowing mutual influence of heat and electric noise between the first group of electronic components and the second group of electronic components to be suppressed. Objects, features, aspects and advantages of the present invention other than described above will become more apparent from the following detailed description of the present invention when taken in conjunction with the accompanying drawings.

DESCRIPTION OF EMBODIMENTS

First Embodiment

Figure 1:
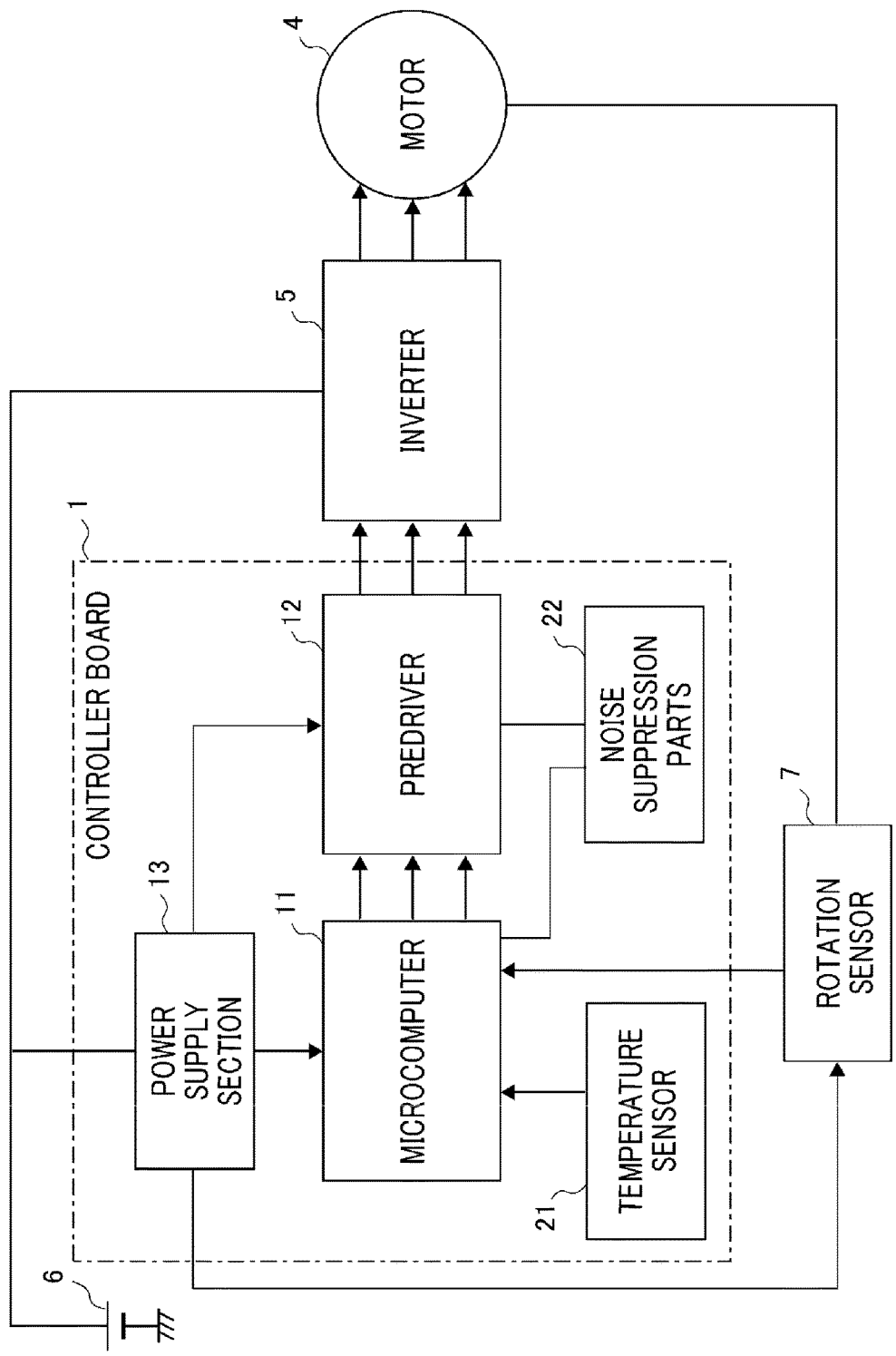
FIG. 1 A diagram showing a configuration of a motor drive unit in accordance with a first embodiment of the invention.
Figure 2:
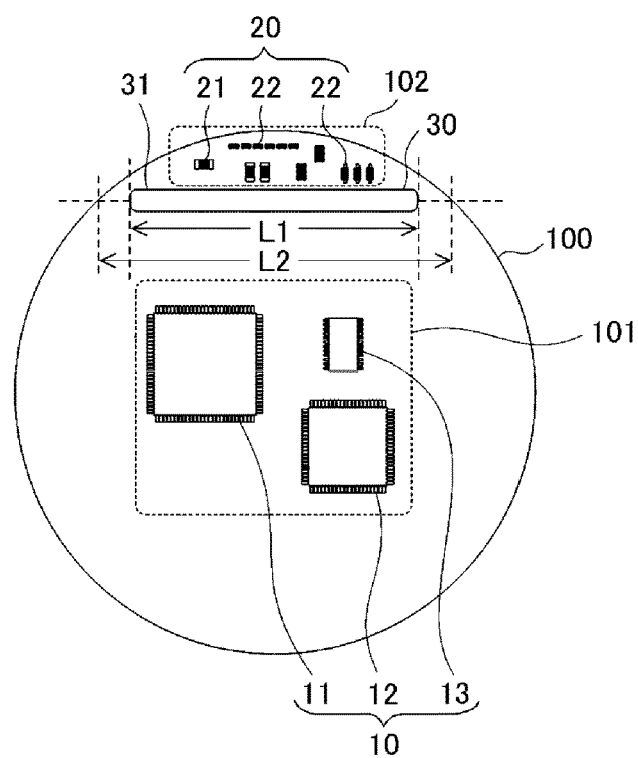
FIG. 2 A diagram showing a separating zone in a controller board in accordance with the first embodiment of the invention.

An electric motor controller in accordance with a first embodiment of the invention is described below with reference to the drawings. FIG. 1 shows a configuration of a motor drive unit including an electric motor controller in accordance with the first embodiment. FIG. 2 shows a controller board of the electric motor controller in accordance with the first embodiment. Note that, through the drawings, the same or corresponding components are denoted by the same reference numerals.

A controller board 1 (indicated by a chain line in FIG. 1) of the electric motor controller includes a plurality of electronic components mounted thereon for controlling drive of a motor 4 as an electric motor. The controller board 1 performs control calculation for driving the motor 4 and also drives an inverter 5 that drives the motor 4. Note that, in the first embodiment, a three-phase brushless motor is used as the motor 4.

A microcomputer 11 performs control calculation for driving the motor 4. A predriver 12 drives the inverter 5 based on the calculation result by the microcomputer 11. The inverter 5 converts direct current power from a battery 6 into three-phase alternating current power necessary for driving the motor 4.

A power supply section 13 transforms a direct current voltage from the battery 6 into a desired direct current voltage and supplies it to the electronic components including the microcomputer 11, the predriver 12 and the like mounted on the controller board 1 and an electronic component, such as a rotation sensor 7, that is not mounted on the controller board 1, but is necessary for the motor drive unit. In the first embodiment, a DCDC switching power supply is used as the power supply section 13. The DCDC switching power supply generally generates switching noise resulting from its switching frequency.

A temperature sensor 21 detects an atmosphere temperature or board temperature of the controller board 1. The microcomputer 11 captures temperature information detected by the temperature sensor 21 and adjusts a controlled variable relating to drive of the motor 4 based on the temperature information. In the first embodiment, a thermistor device is used as the temperature sensor 21.

Noise suppression parts 22 absorb or divert noise that may cause malfunction or damage of the microcomputer 11 or the predriver 12, such as switching noise, surge noise or the like generated from the inverter 5. In the first embodiment, a bypass capacitor, zener diode or the like is used as the noise suppression parts 22.

The rotation sensor 7 detects the rotated angle of the motor 4. The microcomputer 11 drive-controls the motor 4 based on the rotated angle detected by the rotation sensor 7. A resolver, Hall element sensor, magnetic resistance element sensor or the like is used as the rotation sensor 7. Note that, in the example shown in FIG. 1, the rotation sensor 7 is placed outside the controller board 1, however, when the rotation sensor 7 is a packaged device that can be mounted on the board, such as a Hall element sensor or magnetic resistance element sensor, the rotation sensor 7 can be placed on the controller board 1.

Figure 3:
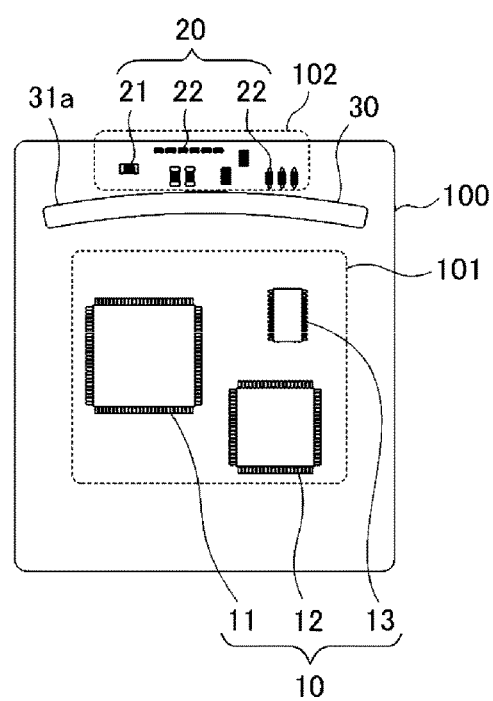
FIG. 3 A diagram showing a variation of the separating zone in the controller board in accordance with the first embodiment of the invention.

Next, the layout of the electronic components on the controller board 1 is described with reference to FIG. 2. A board 100 of the controller board 1 is, for example, a four-layer printed circuit board formed of a glass epoxy board. Note that, in the example shown in FIG. 2, the outer shape of the board 100 is a circle having the same diameter as that of the motor 4, however, the outer shape may also be a rectangle as shown in FIG. 3 or a complicated shape in consideration of the structure of other members, such as the motor 4 and the inverter 5.

The plurality of electronic components mounted on the board 100 are grouped into a first group of electronic components 10 and a second group of electronic components 20 depending on the function or characteristic. The first group of electronic components 10 generates a relatively large amount of heat or electric noise by its operation and include at least one component that is a source of heat or electric noise. In the first embodiment, the microcomputer 11, the predriver 12 and the power supply section 13 are included in the first group of electronic components 10. The amount of heat or electric noise generated from the first group of electronic components 10 is at least larger than the amount of heat or electric noise generated from the second group of electronic components 20.

On the other hand, the second group of electronic components 20 includes at least one component from which influence of heat or electric noise from other components needs to be eliminated to a maximum extent in order to achieve its performance. In the first embodiment, the temperature sensor 21 and the noise suppression parts 22 are included in the second group of electronic components 20. Note that electronic components other than described above may also be included in the first group of electronic components 10 and/or the second group of electronic components 20.

The board 100 includes a separating zone 30 in an area closer to the edge than to the center of the board 100, the separating zone 30 including one or both of a through hole and a notch provided in the board 100. In FIG. 2, the separating zone 30 includes one elongated through hole 31 placed on a straight line. Note that the through hole 31 is what is called a bare hole that is not used for electrical connection.

The first group of electronic components 10 and the second group of electronic components 20 are placed separated by the separating zone 30. The first group of electronic components 10 is placed in a first area 101 on the center side with respect to the separating zone 30 of the board 100. The second group of electronic components 20 is placed in a second area 102 on the edge side with respect to the separating zone 30 of the board 100.

Note that, in FIG. 2, the spaces of the first area 101 and the second area 102 are indicated by dot line for descriptive purposes, however, these spaces are not limited. The first area 101 only needs to be on the center side with respect to the separating zone 30 of the board 100. The second area 102 only needs to be on the edge side with respect to the separating zone 30 of the board 100. Also, in FIG. 2, the frame of dot line indicating the second area 102 encompasses an area other than the board 100, however, actually, the second area 102 exists only on the board 100.

The separating zone 30 only needs to be able to effectively prevent propagation of heat and electric noise between the first area 101 and the second area 102, and the shape and placement of the separating zone 30 can be variously modified. In an example shown in FIG. 3, a separating zone 30 provided on a board 100 in a rectangular shape includes a curved, elongated through hole 31*a*. In an example shown in FIG. 4, a separating zone 30 includes one notch 32. As described above, the shape and placement of the separating zone 30 can be appropriately modified depending on the shape of the board 100 and the arrangement of the electronic components mounted on the board 100.

Various operation and effect obtained by providing the separating zone 30 in the controller board 1 in the first embodiment is described below. When complicated calculation processing is performed in order to precisely control the motor 4, the amount of calculation of the microcomputer 11 increases and the operation frequency is increased in order to perform calculation processing at a higher speed. Accordingly, power consumption of the microcomputer 11 increases, resulting in increase in the amount of generated heat.

Also, when the rotation torque and output power required for the motor 4 increases, current flowing in the inverter 5 increases. Accordingly, power consumption of the predriver 12 for driving the inverter 5 increases, resulting in increase in the amount of generated heat. Furthermore, when power consumption of the microcomputer 11 and the predriver 12 increases, power generated by the power supply section 13 increases, resulting in increase in the amount of generated heat of the power supply section 13.

On the other hand, reduction in the size and weight of the product and components is demanded from the viewpoint of resource saving and energy saving, which makes it difficult to ensure sufficient heat dissipation capability. Because of these reasons, in recent years, operating temperature management of electronic components is required to be performed more strictly. In order to satisfy such a requirement, providing the separating zone 30 including the through hole 31 in the board 100 is effective.

Providing the separating zone 30 to the board 100 changes a portion of the heat carrier between the first area 101 and the second area 102 from glass epoxy resin forming the board 100 and copper foil of the individual layers to air. Air has a very low heat transfer rate in comparison with that of glass epoxy resin and copper foil, so the heat conductivity between the first area 101 and the second area 102 is reduced by air. So, the second group of electronic components 20 placed in the second area 102 is not easily influenced by heat generated from the first group of electronic components 10 placed in the first area 101.

For example, the thermistor device used as the temperature sensor 21 detects an atmosphere temperature around the controller board 1, however, when the thermistor device is influenced by heat generated from other electronic components mounted on the board 100, detecting accurate temperature information becomes difficult. In other words, in order to detect accurate temperature information, the temperature sensor 21 needs to be placed so as not to be influenced by heat generated from surrounding electronic components.

In the first embodiment, the first group of electronic components 10, generating a relatively large amount of heat, is placed in the first area 101, and the temperature sensor 21 is placed in the second area 102. In this way, the temperature sensor 21 and the first group of electronic components 10 are placed separated by the separating zone 30, so the temperature sensor 21 is not easily influenced by heat generated from the first group of electronic components 10. This allows the temperature sensor 21 to accurately measure atmosphere temperature around the controller board 1.

Also, for example, when surge noise occurs due to switching operation of the inverter 5, a zener diode as the noise suppression parts 22 advantageously suppress the surge noise and prevents an integrated circuit, such as the microcomputer 11 and/or the predriver 12, from being damaged by Electrical Over-Stress (EOS) caused by the surge noise.

However, when the temperature of the zener diode increases due to influence of heat generated from other electronic components, the characteristics of the zener diode, such as zener voltage, may vary to reduce the effect of suppressing surge noise. Surge noise suppression needs to be performed in a very short time, such as a few microseconds (s), so stability of the characteristics of the zener diode is very important.

In the first embodiment, the first group of electronic components 10, generating a relatively large amount of heat, is placed in the first area 101, and the noise suppression parts 22 is placed in the second area 102. In this way, the noise suppression parts 22 and the first group of electronic components 10 are placed separated by the separating zone 30, so the noise suppression parts 22 is not easily influenced by heat generated from the first group of electronic components 10. This can stabilize the temperature of the noise suppression parts 22 and maintain the effect of suppressing surge noise.

In this way, the second group of electronic components 20 is not easily influenced by heat generated from the first group of electronic components 10, which can maintain the temperature of the component lower and stabilize the characteristics or functions as the component. As a result, the reliability of the second group of electronic components 20 improves, which is also effective for decreasing the failure rate as the motor drive unit.

Also, in a four-layer printed circuit board, two inner layers are often used as a ground layer and power supply layer. The separating zone 30 partially separates the ground and power supply layers placed in the inner layers of the four-layer printed circuit board, which can increase the impedance of the first area 101 and the second area 102, providing the effect of suppressing influence of mutual noise.

The first group of electronic components 10 includes a component that results in a noise source because of large power consumption and switching operation. Placing the first group of electronic components 10 and the second group of electronic components 20 separated by separating zone 30 can suppress the propagation of noise generated from the first group of electronic components 10 to the second group of electronic components 20 through the ground layer and/or power supply layer.

However, the second group of electronic components 20 placed in the second area 102 is not limited to the temperature sensor 21 and the noise suppression parts 22. An electronic component included in the second group of electronic components 20 only needs to be one that generates relatively small amount of heat and noise. Also, in the first embodiment, the first group of electronic components 10 is placed in the first area 101 and the second group of electronic components 20 is placed in the second area 102, however, this may also be reversed.

The greater the ratio of the length across which the through hole 31 or notch 32 included in the separating zone 30 separates the board 100 to the length of the straight line on the board 100 on which the separating zone 30 is placed (in FIG. 2, L1/L2, where L1 is the length of the through hole 31, and L2 is a width of the board 100 at the straight line on which the through hole 31 is placed), the greater the effects of the separating zone 30 reducing the heat conductivity between the first area 101 and the second area 102 and increasing the impedance of the first area 101 and the second area 102.

Figure 4:
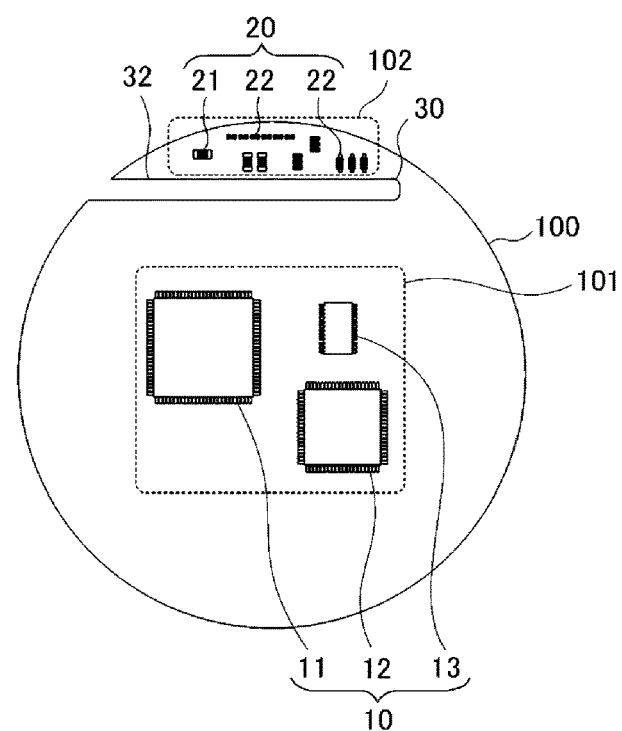
FIG. 4 A diagram showing a variation of the separating zone in the controller board in accordance with the first embodiment of the invention.

In the examples shown in FIGS. 2-4, the ratio at which the through hole 31 or notch 32 included in the separating zone 30 separates the board 100 (L1/L2) is designed to be 80% or more. As this ratio decreases, the effect of the separating zone 30 decreases. The lower limit of the ratio necessary for obtaining a significant effect of suppressing heat and noise was empirically determined to be about 40%.

Note that addition of new components for suppressing heat and noise to the controller board 1 may lead to increase in the cost and the size of the unit. In contrast, providing the separating zone 30 to the board 100 can be performed within the normal manufacturing process, which can improve performance of the controller board 1 without causing increase in the cost and the size of the unit.

As another effect of the separating zone 30, a motor terminal line, a power module terminal line or another terminal line included in the motor drive unit can be routed through the through hole 31 or notch 32 included in the separating zone 30.

Without the through hole 31 in the controller board 1, a lead terminal line of the inverter 5 and the motor terminal line of the motor 4 are routed around the controller board 1, however, with the through hole 31, they can be routed from one side of the controller board 1 to the other through the through hole 31. Thus, the separating zone 30 also provides the effect of efficiently placing the components of the inverter 5 and motor 4 to facilitate reduction in the size of the motor drive unit as a whole.

Furthermore, as another effect of the separating zone 30, air heated by heat generated from the electronic components mounted on the controller board 1, the motor 4, the inverter 5 and the like can be released to the outside through the through hole 31 or notch 32 to improve heat dissipation capability of the motor drive unit.

In an example of the motor drive unit having a structure in which the motor 4, the inverter 5 and the controller board 1 are assembled in one unit, when the controller board 1 without the separating zone 30 is placed in the upper portion of the motor drive unit, the controller board 1 behaves like a cap to impede heat convection. In this case, heated air under the controller board 1 cannot flow to the outside, which reduces heat dissipation capability of the motor drive unit.

In contrast, when the controller board 1 with the separating zone 30 is placed, heated air under the controller board 1 flows to the outside through the through hole 31 or notch 32. This facilitates heat convection within the motor drive unit, improving the heat dissipation capability.

As described above, according to the first embodiment, the first group of electronic components 10 and the second group of electronic components 20 are placed separated by the separating zone 30, which can effectively prevent heat and electric noise generated from the first group of electronic components 10 from propagating to the second group of electronic components 20. So, the second group of electronic components 20 is not easily influenced by heat and electric noise generated from the first group of electronic components 10, which stabilizes the characteristics or functions of the second group of electronic components 20 to improve their reliability.

Also, the terminal lines, such as the motor terminal line, can be routed through the through hole 31 or notch 32, so the components can be efficiently placed. Furthermore, the through hole 31 or notch 32 is provided in the controller board 1, so heated air within the unit is easily released to the outside, which improves the heat dissipation capability. As described above, according to the motor drive unit using the electric motor controller in accordance with the first embodiment, reduction in failure rate, reduction in unit size and improvement of reliability can be achieved.

Second Embodiment

Figure 5:
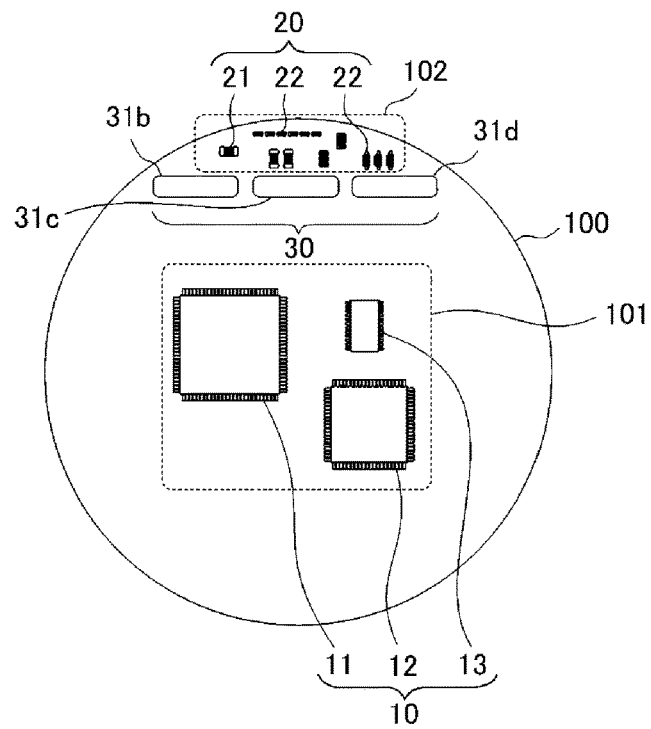
FIG. 5 A diagram showing a separating zone in a controller board in accordance with a second embodiment of the invention.
Figure 6:
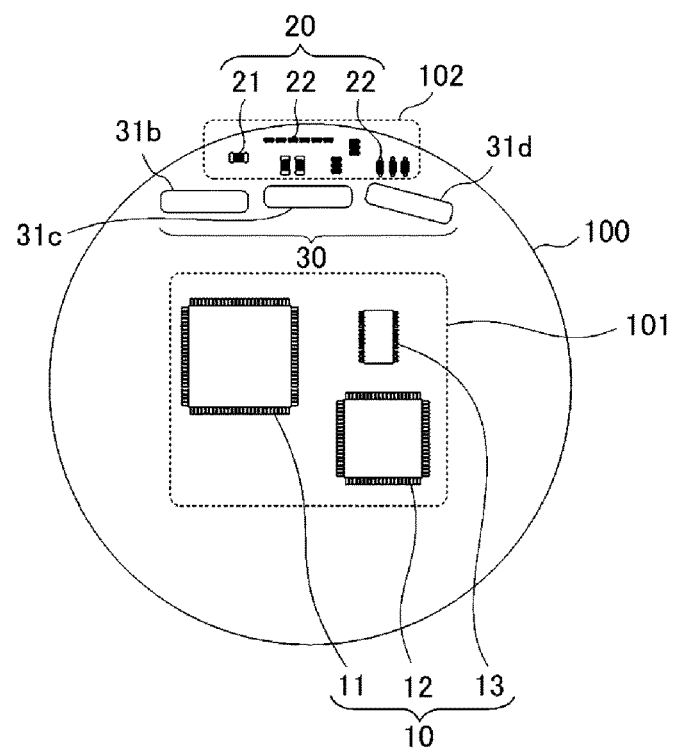
FIG. 6 A diagram showing a variation of the separating zone in the controller board in accordance with the second embodiment of the invention.
Figure 7:
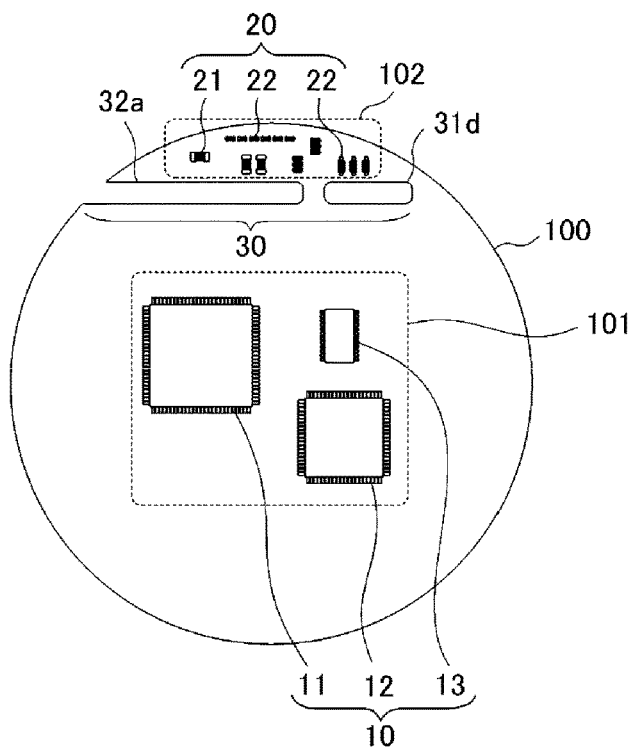
FIG. 7 A diagram showing a variation of the separating zone in the controller board in accordance with the second embodiment of the invention.

FIGS. 5-7 shows a separating zone of a controller board in accordance with a second embodiment of the invention. In the second embodiment, as a variation of the separating zone 30 described in the first embodiment, a separating zone 30 including a plurality of through holes 31 or notches 32 is described. Note that a motor drive unit in accordance with the second embodiment is configured as with the first embodiment, so FIG. 1 is reused and the detail description is omitted.

In an example shown in FIG. 5, the separating zone 30 includes three through holes 31b, 31c, 31d in the same shape, all of which are placed on a straight line. Note that the number of the through holes is not limited to three, but may be two, four or more. Also, in FIG. 5, the three through holes 31b, 31c, 31d are in the same shape, however, they may not be in the same shape. Furthermore, the through holes 31b, 31c, 31d are desirably placed on a straight line, however, they may deviate to an extent from the line, as shown in FIG. 6, as far as the effect of reducing heat conductivity between the first area 101 and the second area 102 can be obtained.

In an example shown in FIG. 7, the separating zone 30 includes a notch 32a and the through hole 31d. In this way, a plurality of a notch and through hole may coexist. Also in this case, the notch and the through hole are desirably placed on a straight line, but may deviate to an extent from the line.

In the second embodiment, in any of the cases of FIGS. 5-7, a wiring trace can be routed on a portion of the board existing between the plurality of through holes 31b, 31c, 31d or notch 32a. When the separating zone 30 is formed of one elongated through hole 31 (see FIG. 2), a wiring trace connecting the first group of electronic components 10 placed in the first area 101 to the second group of electronic components 20 placed in the second area 102 needs to be long because of being routed around the through hole 31.

As the length of the wiring trace increases, the possibility of being influenced by external noise and the inductance component of the wiring trace may increase. When the temperature sensor 21 is influenced by external noise, signal used by the microcomputer 11 for capturing temperature information detected by the temperature sensor 21 may be negatively influenced, which may reduce the accuracy of the temperature information, degrading performance of the controller board 1.

Also, when the inductance component of the wiring trace connected to the noise suppression parts 22 increases, steep surge voltage cannot be prevented, which may negatively influence the performance of the noise suppression parts 22, degrading performance of the controller board 1.

According to the second embodiment, in addition to the effect similar to that of the first embodiment, the separating zone 30 including a plurality of a through hole 31 and notch 32 allows a wiring trace to be routed on a portion of the board between the plurality of a through hole 31 and notch 32, so a negative influence due to routing the wiring trace around the separating zone 30 can be avoided.

Third Embodiment

Figure 8:
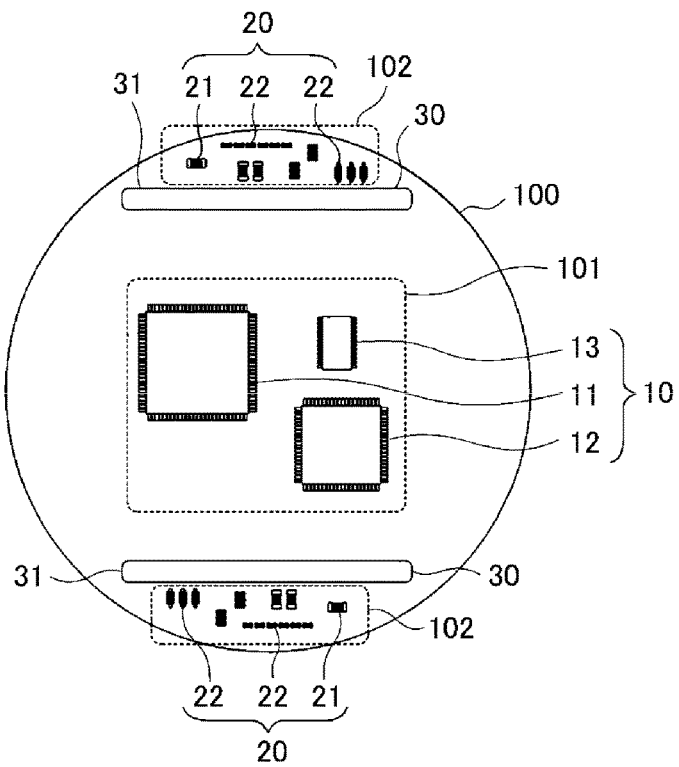
FIG. 8 A diagram showing a separating zone in a controller board in accordance with a third embodiment of the invention.
Figure 9:
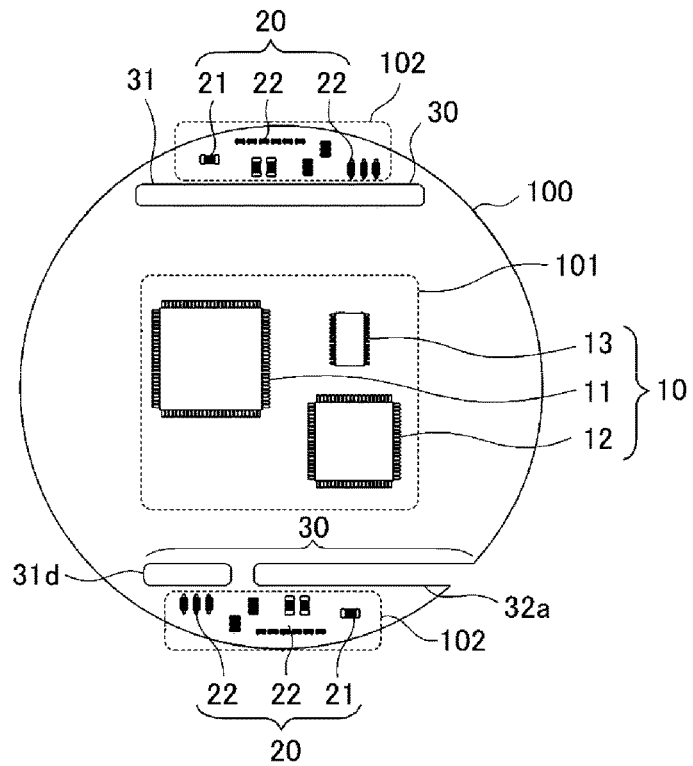
FIG. 9 A diagram showing a variation of the separating zone in the controller board in accordance with the third embodiment of the invention.

FIGS. 8 and 9 show a separating zone of a controller board in accordance with a third embodiment of the invention. In the third embodiment, as a variation of the separating zone 30 described in the first embodiment, the case of a plurality of separating zones 30 provided in the board 100 is described. Note that a motor drive unit in accordance with the third embodiment is configured as with the first embodiment, so FIG. 1 is reused and the detail description is omitted.

In an example shown in FIG. 8, a separating zone 30 including one elongated through hole 31 is placed in an upper portion and a lower portion of the board 100. In an example shown in FIG. 9, a separating zone 30 including one elongated through hole 31 is placed in an upper portion of the board 100, and a separating zone 30 including a notch 32a and a through hole 31d is placed in a lower portion of the board 100.

In both the cases, the board 100 includes two second areas 102 each with the second group of electronic components 20 placed therein. Note that, in FIGS. 8 and 9, the separating zone 30 is provided in two portions of the board 100, however, it may be provided in three or more portions. Also, in providing a plurality of separating zones 30, the shape and number of through holes 31 and notches 32 in each of the separating zones 30 is not limited.

When the second area 102 is placed only in one portion as described in the first and second embodiments, placing the temperature sensor 21 and the noise suppression parts 22 close to all of a plurality of integrated circuits placed in the first area 101, including the microcomputer 11 and the predriver 12, is difficult and needs a long wiring trace.

In contrast, in the third embodiment, the temperature sensor 21 and the noise suppression parts 22 can be placed close to each of the plurality of integrated circuits. Also in the third embodiment, as with the second embodiment, the separating zone 30 including a plurality of a through hole 31 and notch 32 allows a wiring trace to be routed on a portion of the board between the plurality of a through hole 31 and notch 32.

According to the third embodiment, in addition to the effect similar to that of the first and second embodiments, the board 100 includes a plurality of second areas 102, which allows the second group of electronic components 20 to be more efficiently placed.

Fourth Embodiment

Figure 10:
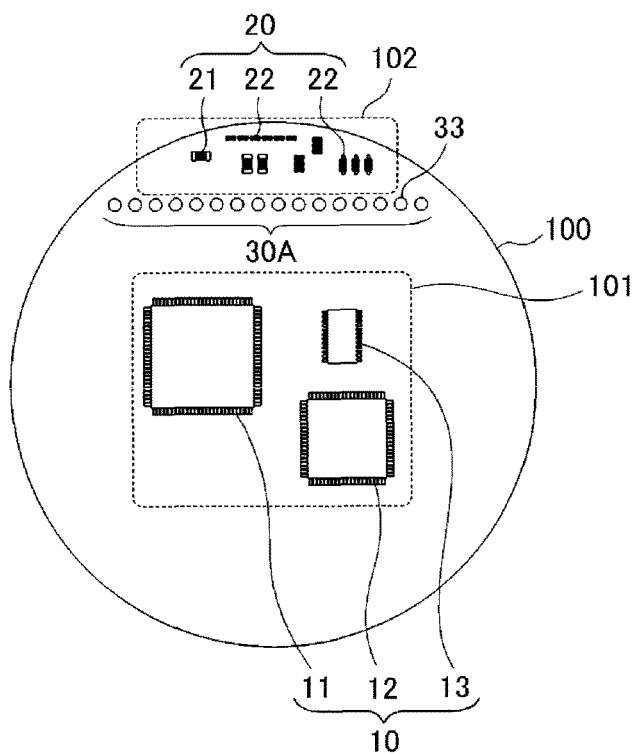
FIG. 10 A diagram showing a separating zone in a controller board in accordance with a fourth embodiment of the invention.
Figure 11:
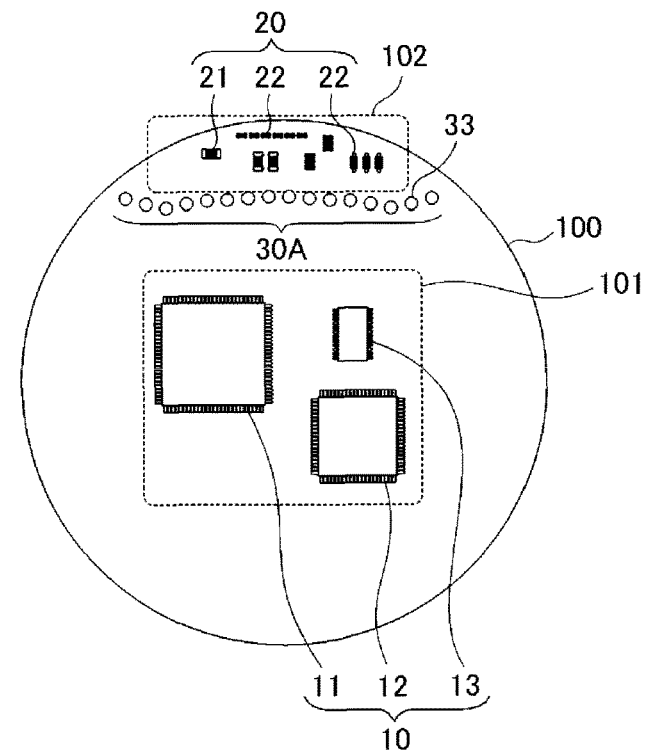
FIG. 11 A diagram showing a variation of the separating zone in the controller board in accordance with the fourth embodiment of the invention.

FIGS. 10 and 11 show a separating zone of a controller board in accordance with a fourth embodiment of the invention. A separating zone 30A of the controller board 1 in accordance with the fourth embodiment includes a plated through hole 33 that is a through hole inside of which a conductor is formed. Note that a motor drive unit in accordance with the fourth embodiment is configured as with the first embodiment, so FIG. 1 is reused and the detail description is omitted.

In an example shown in FIG. 10, a separating zone 30A includes a plurality of plated through holes 33 which are placed on a straight line. Note that the plurality of plated through holes 33 are desirably placed almost on a straight line, however, they may deviate to an extent from the line, as shown in FIG. 11, as far as the effect of reducing heat conductivity between the first area 101 and the second area 102 can be obtained.

The plated through holes 33 serve as a connector for passing input signal to the controller board 1 and an output signal from the controller board 1. In order to output a drive signal to the inverter 5 for driving the motor 4, the controller board 1 is connected to the inverter 5 by a bus bar or cable. At this point, one end of the bus bar or cable is inserted and soldered into the plated through holes 33 with the stability of electric and structural connection ensured. Note that the controller board 1 is also connected to the motor 4, the rotation sensor 7 and the battery 6 in addition to the inverter 5, and these connections may also be performed using the plated through holes 33.

Figure 12:
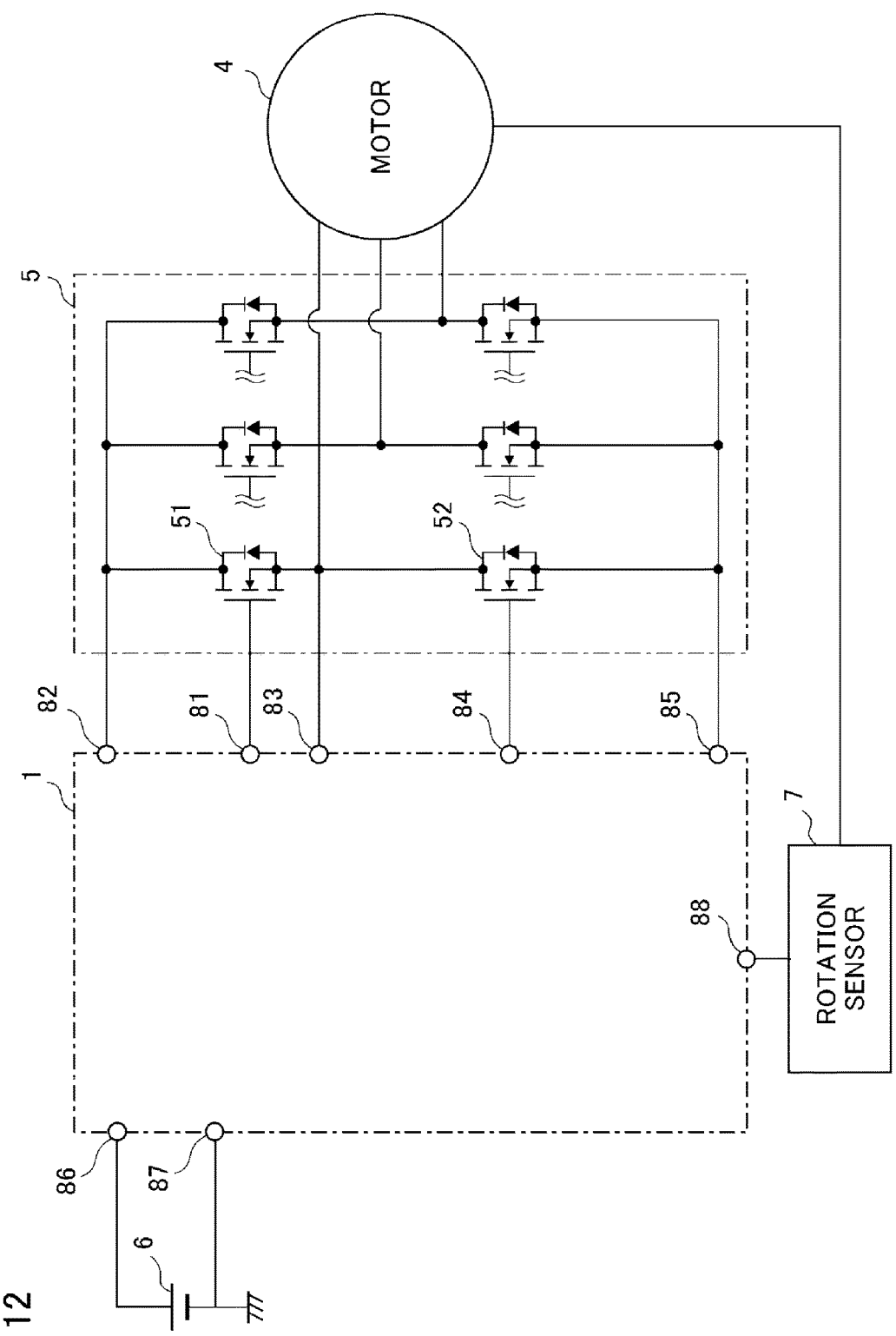
FIG. 12 A diagram showing a signal line connected by a plated through hole in the controller board in accordance with the fourth embodiment of the invention.

Signal and power passed by the plated through holes 33 in the controller board 1 in accordance with the fourth embodiment is described with reference to FIG. 12. A terminal 81 connected to the gate of a High-side MOSFET 51 included in the inverter 5, a terminal 82 connected to the drain, a terminal 83 connected to the source, a terminal 84 connected to the gate of a Low-side MOSFET 52, a terminal 85 connected to the source, a power supply terminal 86 connected to the battery 6, a ground terminal 87 and a terminal 88 for rotated angle signal of the rotation sensor 7 are led out using the plated through holes 33.

Note that the semiconductor switching device included in the inverter 5 is not limited to a MOSFET, but other semiconductor switching devices, such as IGBT or bipolar transistor, may also be used.

The separating zone 30A including the plurality of plated through holes 33 also provides the effects of reducing the heat conductivity between the first area 101 and the second area 102 and increasing the impedance of the first area 101 and the second area 102, as with the first embodiment. These effects become greater as the ratio of the length across which the plated through holes 33 included in the separating zone 30A separates the board 100 to the length of the straight line on the board 100 on which the separating zone 30A is placed increases.

In the examples shown in FIGS. 10-11, the ratio at which the plated through holes 33 included in the separating zone 30A separates the board 100 is designed to be 50% or more. As this ratio decreases, the effect of the separating zone 30A decreases. The lower limit of the ratio necessary for obtaining a significant effect of suppressing heat and noise was empirically determined to be about 40%.

Note that the plated through holes 33 are filled with solder, so the plated through holes 33 do not change the whole heat carrier therein from glass epoxy resin or copper foil to air, unlike the through hole 31 in the first to third embodiments. However, replacing a portion of a copper foil layer with high heat conductivity, such as a ground layer and power supply layer, with the plated through holes 33 allows an effect of reducing heat conductivity between the first area 101 and the second area 102 to be expected.

As an alternative, the separating zone 30A may include a plated through hole 33 for electrical connection and a through hole 31 or notch 32 not for electrical connection.

Also, one board 100 may include both a separating zone 30A with a plated through hole 33 and a separating zone 30 with a through hole 31.

According to the fourth embodiment, in addition to the effect similar to that of the first to third embodiments, the plated through holes 33 included in the separating zone 30A can be used for electrically connecting the controller board 1 to other components including the inverter 5, which increases the degree of designing freedom of the controller board 1. Note that, according to the invention, the embodiments may be freely combined or the embodiments may be appropriately modified or omitted within the scope of the invention.

The invention claimed is:

1. An electric motor controller comprising:
a board;
a plurality of electronic components mounted on the board, the plurality of electronic components being for controlling drive of an electric motor; and
a separating zone in an area closer to an edge than to a center of the board, the separating zone including one or both of a through hole and a notch provided in the board,
wherein the plurality of electronic components are grouped into a first group of electronic components and a second group of electronic components, depending on a function or a characteristic of each of the plurality of electronic components,
the first group of electronic components and the second group of electronic components are placed to be separated by the separating zone, and
a ratio of a first length of one or both of the through hole and the notch to a second length of a straight line on the board on which the separating zone is placed is at least 40%.

2. The electric motor controller according to claim 1, wherein the through hole comprises a conductor disposed inside the through hole.

3. The electric motor controller according to claim 1, wherein any one or any combination of a motor terminal line, a power module terminal line and another terminal line is routed through one or both of the through hole and the notch.

4. The electric motor controller according to claim 1, wherein a first operation of the first group of electronic components generates a larger amount of heat or electric noise than that generated by a second operation of the second group of electronic components,
the first group of electronic components includes a first component that is a source of heat or electric noise, and
the second group of electronic components includes a second component to which influence of heat or electric noise from other components needs to be eliminated in to achieve performance of the second component.

5. The electric motor controller according to claim 1, wherein the ratio of the first length of one or both of the through hole and the notch to the second length of the straight line on the board on which the separating zone is placed is at least 80%.

6. An electric motor controller comprising:
a board;
a plurality of electronic components mounted on the board, the plurality of electronic components being for controlling drive of an electric motor; and
a separating zone in an area closer to an edge than to a center of the board, the separating zone including a plurality of the through holes provided in the board and placed on a straight line,
wherein the plurality of electronic components are grouped into a first group of electronic components and a second group of electronic components, depending on a function or a characteristic of each of the plurality of electronic components, and
the first group of electronic components and the second group of electronic components are placed to be separated by the separating zone.

7. An electric motor controller comprising:
a board;
a plurality of electronic components mounted on the board, the plurality of electronic components being for controlling drive of an electric motor; and
a separating zone in an area closer to an edge than to a center of the board, the separating zone including one or both of a through hole and a notch provided in the board,
wherein the plurality of electronic components are grouped into a first group of electronic components and a second group of electronic components, depending on a function or a characteristic of each of the plurality of electronic components,
the first group of electronic components and the second group of electronic components are placed to be separated by the separating zone,
a first operation of the first group of electronic components generates a larger amount of heat or electric noise than that generated by a second operation of the second group of electronic components,
the first group of electronic components includes a first component that is a source of heat or electric noise,
the second group of electronic components includes a second component to which influence of heat or electric noise from other components needs to be eliminated to achieve performance of the second component,
the first group of electronic components is placed in a first area on a center side with respect to the separating zone of the board, and
the second group of electronic components is placed in a second area on an edge side with respect to the separating zone of the board.

8. The electric motor controller according to claim 7, wherein the separating zone includes a plurality of the separating zones, and
the second area includes a plurality of second area.

* * * * *